United States Patent
Ohno

(10) Patent No.: US 6,535,010 B2
(45) Date of Patent: Mar. 18, 2003

(54) CHECKER HEAD AND A METHOD OF MANUFACTURING THE SAME

(75) Inventor: Shinji Ohno, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/801,702

(22) Filed: Mar. 9, 2001

(65) Prior Publication Data

US 2001/0035761 A1 Nov. 1, 2001

Related U.S. Application Data

(63) Continuation of application No. PCT/JP99/04928, filed on Sep. 8, 1999.

(30) Foreign Application Priority Data

Sep. 10, 1998 (JP) .............................. 10-256313

(51) Int. Cl.[7] .............................................. G01R 31/02
(52) U.S. Cl. .................... 324/761; 324/754; 324/757; 324/756
(58) Field of Search ................................. 324/755, 756, 324/757, 761; 439/482, 260, 330, 347

(56) References Cited

U.S. PATENT DOCUMENTS 5,410,260 A * 4/1995 Kazama ...................... 324/758
5,990,697 A * 11/1999 Kazama ...................... 324/72.5

FOREIGN PATENT DOCUMENTS

| JP | 64-71141 | 3/1989 |
|---|---|---|
| JP | 3-85456 | 4/1991 |
| JP | 6-138146 | 5/1994 |
| JP | 6-196535 | 7/1994 |
| JP | 6-317624 | 11/1994 |
| JP | 11-281674 | 10/1999 |

OTHER PUBLICATIONS

U.S. patent application Ser. No. 09/463,995, filed May 09, 2000 pending.

* cited by examiner

Primary Examiner—Kamand Cuneo
Assistant Examiner—Tung X. Nguyen
(74) Attorney, Agent, or Firm—Oblon, Spivak, McClelland, Maier & Neustadt, P.C.

(57) ABSTRACT

A checker head including an intermediate plate which is sandwiched between a front plate and a rear plate. A front tip part of an electro-conductive contact protrudes from a front surface of the front plate and is configured to contact an object to be inspected. A conductive wire is inserted into a rear through hole of the rear plate and bonded to the rear plate. An electro-conductive spring is provided in an intermediate through hole of the intermediate plate between the conductive wire and a rear brim part of the contact pin in a compressed state. One end of the conductive wire which contacts the spring and a front surface of the rear plate which faces the an intermediate plate is on a same plane.

6 Claims, 8 Drawing Sheets

To Tester

To Tester

CHECKER HEAD AND A METHOD OF MANUFACTURING THE SAME

CROSS-REFERENCE TO RELATED APPLICATIONS

This application is a Continuation of application Serial No. PCT/JP99/04928 Filed on Sep. 8, 1999.

The present application claims priority under 35 U.S.C. §119 to Japanese Patent Application No. 10-256313, filed Sep. 10, 1998. Further the present application claims priority under 35 U.S.C. §120 to International Application No. PCT/JP99/04928, filed Sep. 8, 1999, entitled "CHECKER HEAD AND METHOD OF MANUFACTURING THE CHECKER HEAD." The contents of these applications are incorporated herein by reference in their entirety.

BACKGROUND OF THE INVENTION

1. Field of the Invention

The present invention relates to a checker head and a method of manufacturing the checker head.

2. Discussion of the Background

One example of a conventional checker head is shown in FIG. 9. A checker head 70 shown in FIG. 9 has a structure wherein a lot of arrangement of a contact pin 71, a push spring 72, a pull spring 73 and a conductive wire 74 being disposed in a straight line are penetrated through four bakelite boards 81–84 laminated. Of course a penetration hole to pass the contact pin 71 and so forth is made for each Bakelite board 81–84. And the contact pin 71 has a nail-shape, and whereof edge protrudes from the Bakelite board 81 of the front. In addition, the penetration hole of the bakelite board 81 has a diameter smaller than that of a bakelite board 82, and then the protrusion of the contact pin 71 is regulated by a brim part of the contact pin 71 being contact with a step part of them.

The conductive wire 74 connected with a circuit tester is inserted into the inside of the pull spring 73, and is soldered as shown in FIG. 10. The push spring 72 is assembled in a compressed state in a checker head 70, and pushes the contact pin 71 toward the upper part and the pull spring 73 toward the lower part in FIG. 9. By the pushing pressure of the push spring 72, a contact pin 71 and the pull spring 73 (besides, the conductive wire 74) are connected electrically. In particular, when the tip of the contact pin 71 is pushed to a test pad 97 of a printed circuit 96 that is an inspected object, the pushing presser is increased, and then the electrical connection becomes more certain as the push spring 72 is compressed more. In this state, an electricity signal (a voltage or a current) can is put to the test pad 97 from the circuit tester, or an electricity signal of the test pad 97 (the same) can be detected with the circuit tester.

However, above described conventional checker head 70 includes the following problems. In the first, an assembling operation of the pull spring 73 and the conductive wire 74 (FIG. 10) and a soldering operation are included in its manufacturing process. These operations are inefficient remarkably because of being done in manual operations. In addition, they are easy to make a mistake, and then the yield is low. In the second, the conductive wire 74 must be a material that can be pushed into the pull spring 73. Because of this, a large conductive wire cannot be used, so that a large current cannot be coped with. In the third, the pushing presser of each contact pin 71 against the test pad 97 is easy to become nonuniform. The reason is because a foreign material is easy to come into when the pull spring 73 is assembled in the Bakelite board 83 in the manufacturing process, and then the spring pressure becomes nonuniform. In the fourth, because there are two kinds of springs, and besides, four pieces of Bakelite boards are used, the parts count is too many, and the burden of the manufacturing control is too big.

SUMMARY OF THE INVENTION

According to one aspect of the present invention, a checker head includes a front plate, a rear plate, an intermediate plate, an electro-conductive contact pin, a conductive wire and an electro-conductive spring. A front through hole is formed in the front plate which has a front surface configured to face an object to be inspected. A rear through hole is formed in the rear plate to correspond to the front through hole of the front plate. An intermediate through hole is formed in the intermediate plate to correspond to the front and rear through holes. The intermediate plate is sandwiched between the front plate and the rear plate. The electro-conductive contact pin has a front tip part and a rear brim part which has a diameter larger than that of the front through hole. The front tip part protrudes from the front surface of the front plate and is configured to contact the object to be inspected. The contact pin is positioned such that the rear brim part is located in the intermediate through hole. The conductive wire is inserted into the rear through hole of the rear plate and bonded to the rear plate. The electro-conductive spring is provided in the intermediate through hole between the conductive wire and the rear brim part of the contact pin in a compressed state. The spring electrically connects the contact pin and the conductive wire. One end of the conductive wire which contacts the spring and a front surface of the rear plate which faces the an intermediate plate are on a same plane.

According to another aspect of the present invention, a method of manufacturing a checker head includes inserting a conductive wire in a rear through hole of a rear plate (Process 1). The conductive wire and the rear plate are bonded together (Process 2). A portion of the conductive wire protruding from a front surface of the rear plate which faces an intermediate plate is removed (Process 3). A spring is inserted in an intermediate through hole of the intermediate plate. An electro-conductive contact pin is inserted in a front through hole of a front plate from a rear surface of the front plate facing the intermediate plate such that a front tip part of the contact pin protrudes from a front surface of the front plate. The rear plate, the intermediate plate and the front plate are connected to sandwich the intermediate plate between the front and rear plates and to compress the spring between the conductive wire and the contact pin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
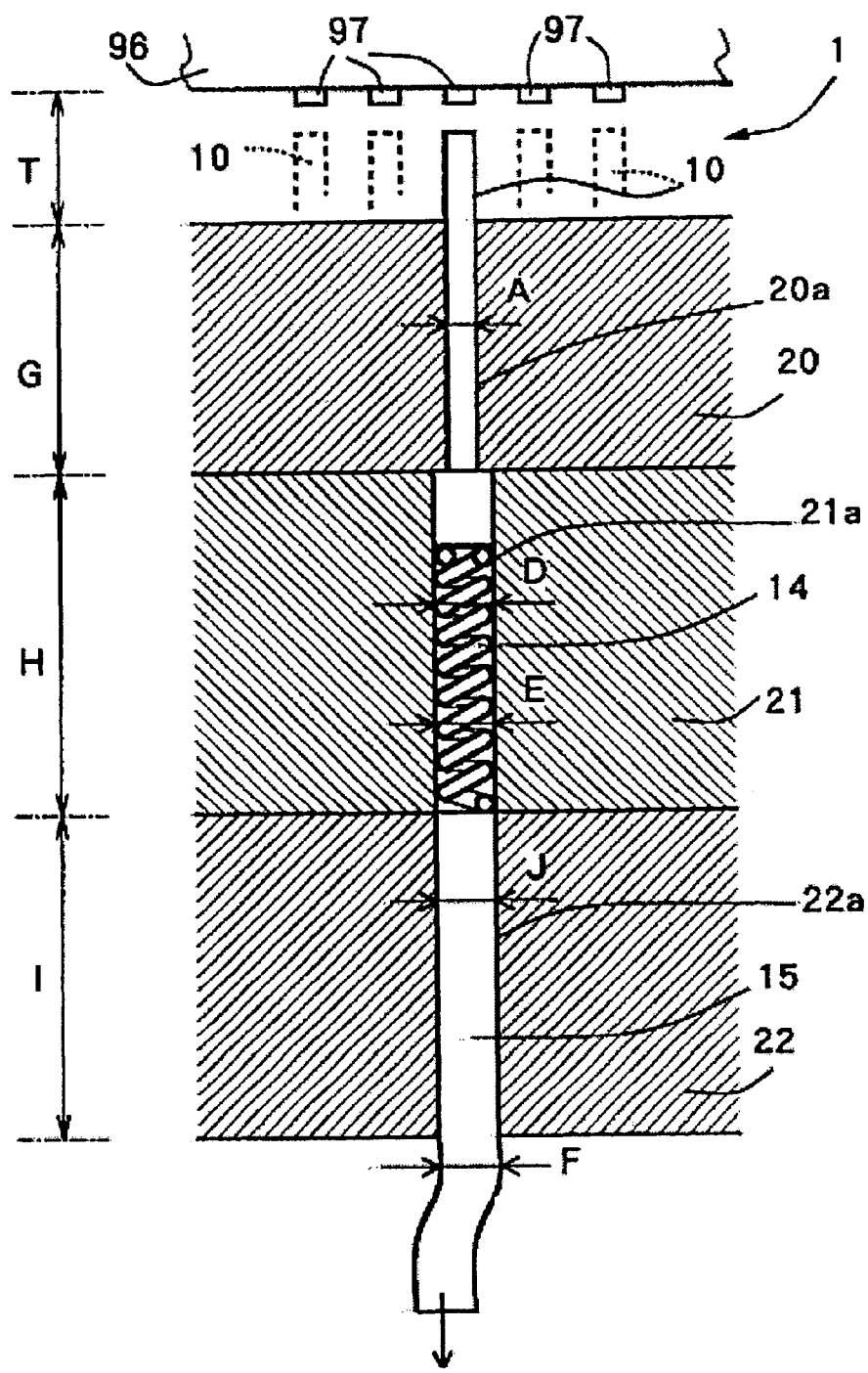
FIG. 1 is a cross-sectional view showing total constitution of a checker head.

The preferred embodiments will now be described with reference to the accompanying drawings, wherein like reference numerals designate corresponding or identical elements throughout the various drawings.

A preferred embodiment that realizes the present invention is described in detail with referring to drawings and figures as follows. Prominent features of a checker head 1 related to this detailed description of the preferred embodiment are shown in FIG. 1. The checker head 1 has a structure wherein a contact pin 10, a spring 14 and a conductive wire 15 being disposed in a straight line penetrate through a laminating body with a front surface plate 20, an intermediate plate 21 and a rear surface plate 22.

Figure 2:
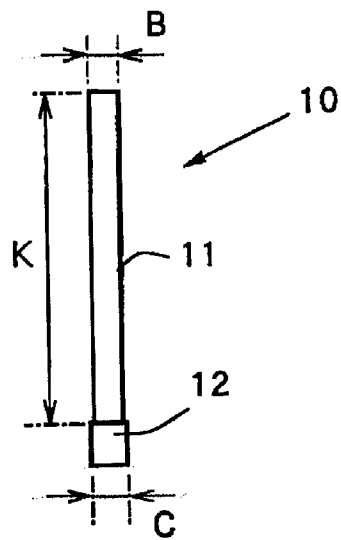
FIG. 2 is a figure showing a contact pin.

A contact pin 10 is a nail shaped member having a shank 11 and a brim part 12, and is formed by a tool steel such as SK materials as shown in FIG. 2. The diameter B of the shank 11 is 0.13 mm, and the diameter C of the brim part 12 is 0.18 mm. The length K of the shank 11 is 2.0 mm. A conductive spring 14 is 0.18 mm in outside diameter E and 2.0 mm in free length, and is located behind of the brim part 12 of the contact pin 10 (the downward in FIG. 1). A conductive wire 15 has a diameter F of 0.18 mm, and is located more behind of the spring 14.

A front surface plate 20, an intermediate plate 21 and a rear surface plate 22 are flat board-shaped members formed by materials with the insulation nature and the proper hardness such as engineering plastic, and are bonded mutually. In these three pieces of plate 20, 21, 22 respectively, a hole (a drilled hole) 20a, 21a, 22a wherein a contact pin 10, a spring 14 or a conducting wire 15 is put is formed. A front surface plate 20 has a depth G of 1.5 mm and the diameter A of the hole 20a is 0.15 mm. An intermediate plate 21 has a depth H of 2.0 mm and the diameter D of the hole 21a is 0.20 mm. A rear surface plate 22 has a depth I of 2.0 mm and the diameter J of the hole 22a is 0.20 mm identically with the intermediate plate 21.

As for a contact pin 10, a brim part 12 is located in a hole 21a of an intermediate plate 21 and a shank 11 is located in a hole 20a of a front surface plate 20. And the tip of the shank 11 protrudes outside, and the protrusive length T is about 0.5 mm. Because the diameter C of the brim part 12 is larger than the diameter A of the hole 20a of the front surface plate 20, the contact pin 10 cannot move more to the front from the state that the front side of the brim part 12 is in contact with the back side of the front surface plate 20.

A spring 14 is located in a hole 21a of an intermediate plate 21. The free length of the spring 14 is equal to the depth H of the intermediate plate 21, so that the spring is compressed by the length of a brim part 12 of the contact pin 10 being in the hole 21a.

Figure 3:
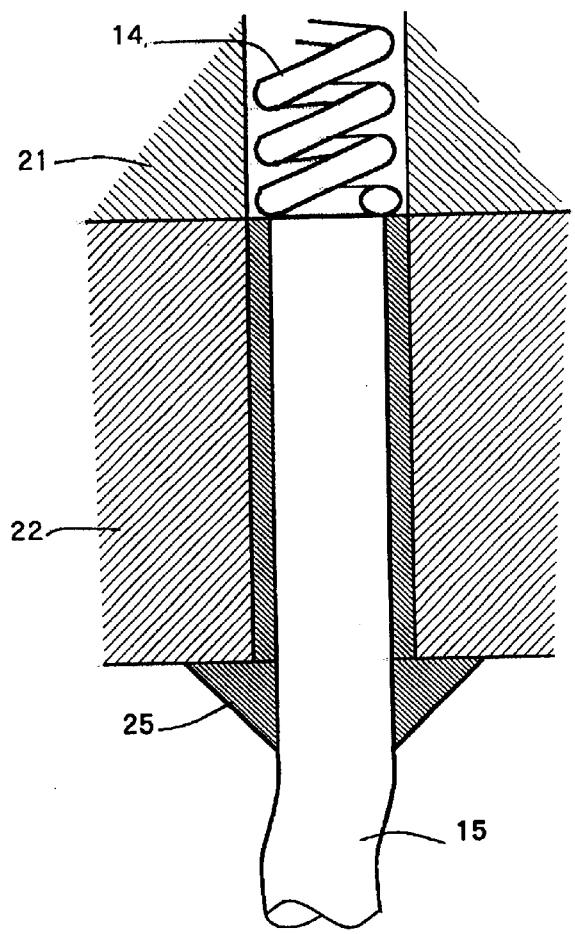
FIG. 3 is an enlarged drawing for ajoint part of a rear surface plate and a conductive wire.

A conductive wire 15 penetrates through a hole 22a of a rear surface plate 22, and the posterior side (the downwards in FIG. 1) goes outside, and is connected to a circuit tester. A conductive wire 15 and a rear surface plate 22 are bonded by adhesive agent 25 as shown by expanding in FIG. 3. And, the spring 14 side of the conductive wire 15 and the adhesive agent 25 is ground, so that they have flat faces against to the surface of a rear surface plate 22. Still, an adhesive agent 25 shown in FIG. 3 is in a state of being solidified.

In this state, the spring 14 is compressed a little, and the conductive wire 15 of the way afterwards is fixed to the rear surface plate 22. Because of this, a contact pin 10 is pushed to the front (the upwards in FIG. 1) by elasticity of the spring 14. And in this state, by elasticity of spring 14, the contact pin 10 contacts with the spring 14, are the spring 14 contacts with the conductive wire 15. By this, it is electrically connected from the contact pin 10 to the conductive wire 15. In this, because the diameter F of the conductive wire 15 is equal to the outside diameter E of the spring 14, it is larger than the average of the outside diameter and the inside diameter of the spring 14 naturally. Because of this, the conductive wire 15 needs not to have been included by the internal hollow part of the spring 14, so that the end face of the conductive wire 15 must contact with the lower part edge in FIG. 1 of a spring 14.

Still, only one set of a contact pin 10 is shown in FIG. 1, but many set are installed in parallel in a front surface plate 20 and so forth really. By the above-mentioned measurements, a contact pin 10 can be arranged by 0.25 mm pitch.

This checker head 1 is used in a state of connecting a conductive wire 15 to a circuit tester such as a device control tester. When the tip of a contact pin 10 is pushed to a test pad 97 of a printed circuit 96 in the state, the circuit tester and the test pad 97 are connected electrically over the contact pin 10, a spring 14 and a conductive wire 15, and then a characteristic test on the printed circuit 96 by the circuit tester comes into a state to be possible. This time, the contact pin 10 is pushed toward the lower part in FIG. 1 by the test pad 97, and the spring 14 is compressed more. Because of this, the contact pin 10 is pushed back by elasticity of the spring 14, and by this pushing back the contact pin 10 contacts surely more with the test pad 97 and the spring 14 contacts surely more with the contact pin 10, and then good electrical continuity is secure. Therefore, over this checker head, an electricity signal of a voltage or an electric current can be applied from the circuit tester to the test pad 97, and an electricity signal of the test pad 97 can be measured with the circuit tester reversibly.

And, in this checker head 1, because a plane where the end face that contacts the spring 14 in the conductive wire 15 becomes flat on the surface of the rear surface plate 22, the compressing degree of every spring 14 is uniform. Because of this, a pressing force of each contact pin 10 pushing a test pad 97 is uniform. In addition, a large electric current can be coped with because a bit large wire of 0.18 mm φ is used as the conductive wire 15. Because of this, a characteristic test to put the voltage of 100V class on can be done.

A description is made of a manufacturing method of the checker head 1. As parts for the manufacturing the checker head 1, a contact pin 10, a spring 14, a conductive wire 15, a front surface plate 20, an intermediate plate 21 and a rear surface plate 22 of the dimension with above-mentioned each are prepared. In the front surface plate 20, the intermediate plate 21 and the rear surface plate, a hole of a predetermined diameter, in which a contact pin 10, etc. is inserted is formed respectively. And, adhesive agent for the adhesion of the conductive wire 15 and the rear surface plate 22 is prepared. As this adhesive agent, a low viscosity adhesive agent popular named "instant adhesive" (brand name "Bond Alone Alpha" made by Toagousei co., ltd., for example) may be used.

Figure 4:
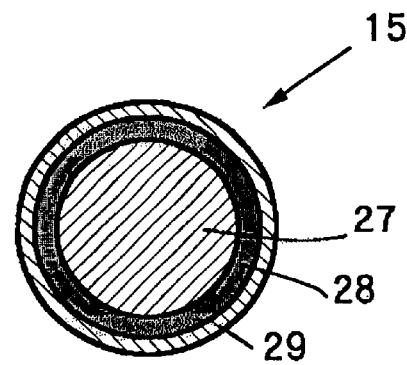
FIG. 4 is a cross-sectional view of a self-welding enameled wire.

As a conductive wire 15, a copper wire 27 is coated with an insulating layer 28, and more thereupon, coated with an adhesive layer 29 is used as shown in FIG. 4. The conductive wire of this structure has self-bonding. Such a conductive wire is provided as "self welding enameled wire" in a market.

Figure 5:
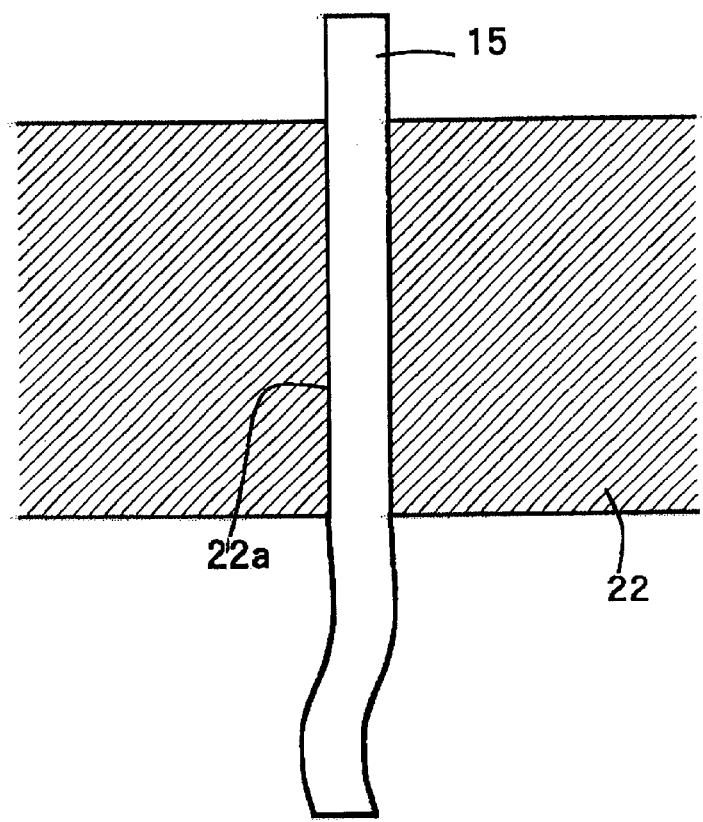
FIG. 5 is a figure to show the state wherein a conductive wire is passed through a hole of a rear surface plate.

At a Process 1 (Wire Inserting Process), a conductive wire 15 is put with a rear surface plate 22. With this purpose, the conductive wire 15 is passed through a hole 22a of the rear surface plate 22 as shown in FIG. 5.

In this state, self-bonding of the conductive wire 15 is used, and a tentative fixation is done. For this purpose, in proportion to the type of the adhesive layer 29, either means of being blown with hot blast means of being sunk in a solvent such as alcohol or means of being energized in a conductive wire 27 is used, for example. Then the adhesive layer melts or swells once, and then solidify again. By this, the conductive wire 15 is rigidified in the rear surface plate 22 temporarily. This tentative fixation is done whenever one or around several conductive wire 15 is inserted in the rear surface plate 22. In the tentative fixed state, there is no the adhesive strength as the case that bonded by the low viscosity adhesive agent, but the conductive wire 15 needs not slipping out by it self from a hole 22a of the rear surface plate 22. Because of this, while the plugging work of the conductive wire 15 is successively, the conductive wire 15 inserted in already needs not slipping out. In addition, while the plugging work, a wiring work such as connecting to a circuit tester can be done, too.

Figure 6:
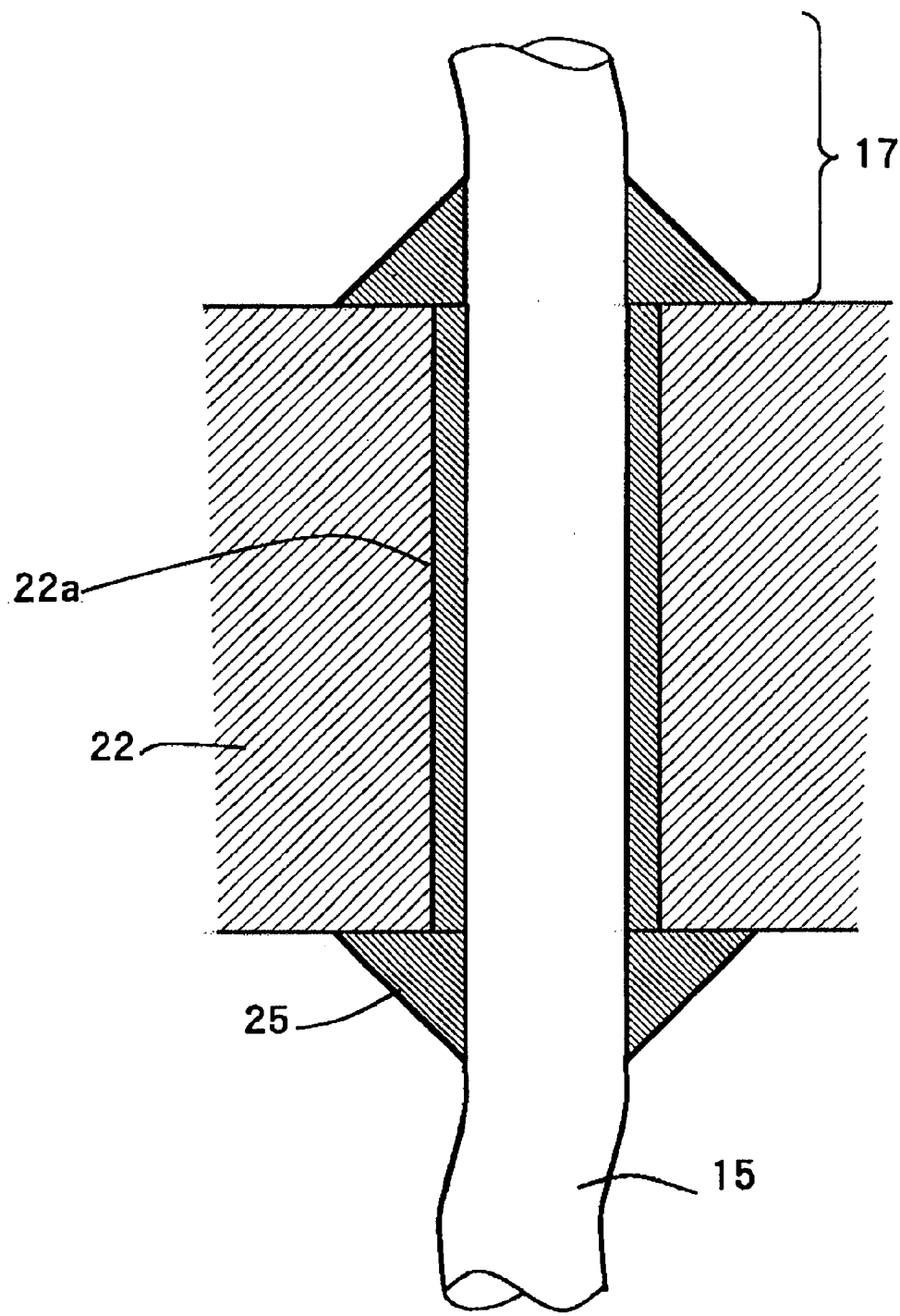
FIG. 6 is an enlarged view to show the state wherein a rear surface plate and a conductive wire are bonded together.

After inserting and tentative fixation of all conductive wire 15s and necessary wiring work are finished, during Process 2 (Wire Bonding Process), the conductive wire 15 and the rear surface plate 22 are bonded perfectly. The reason is because with only adhesive strength of tentative fixation, the conductive wire 15 may slip out without being born upon elasticity of a spring 14 later. Thus low viscosity adhesive agent is supplied in the clearance of the conductive wire 15 and the rear surface plate 22 from both sides. Then, the low viscosity adhesive agent seeps into the clearance because a hole 22a of the rear surface plate 22 is a little larger than the diameter of the conductive wire 15. And the low viscosity adhesive agent solidifies. By this, a state shown in FIG. 6 is provided. In this state, the clearance of the conductive wire 15 and the hole 22a of the rear surface plate 22 is filled with the low viscosity adhesive agent 25, so that the adhesive strength of strong power is provided.

At a Process 3 (Wire Flattening Process), a too much part protruding from a surface of the rear surface plate 22 is removed. Furthermore, this surface is ground, and then a state shown in FIG. 7 is got.

In this state, a surface 22f of the rear surface plate 22 is identical one flat side to an end face 15f of the conductive wire 15. Of course, in this state, the adhesion state with the conductive wire 15 and the rear surface plate 22 is strong. It is preferable that the gold plating or the nickel and gold plating will be put for the end face 15f of the conductive wire 15 by electroless deposition method in this state. The reason is because the oxidation of the end face 15f is prevented by this gold plating layer, and then a contact resistance with the spring 14 does not increase later.

Figure 8:
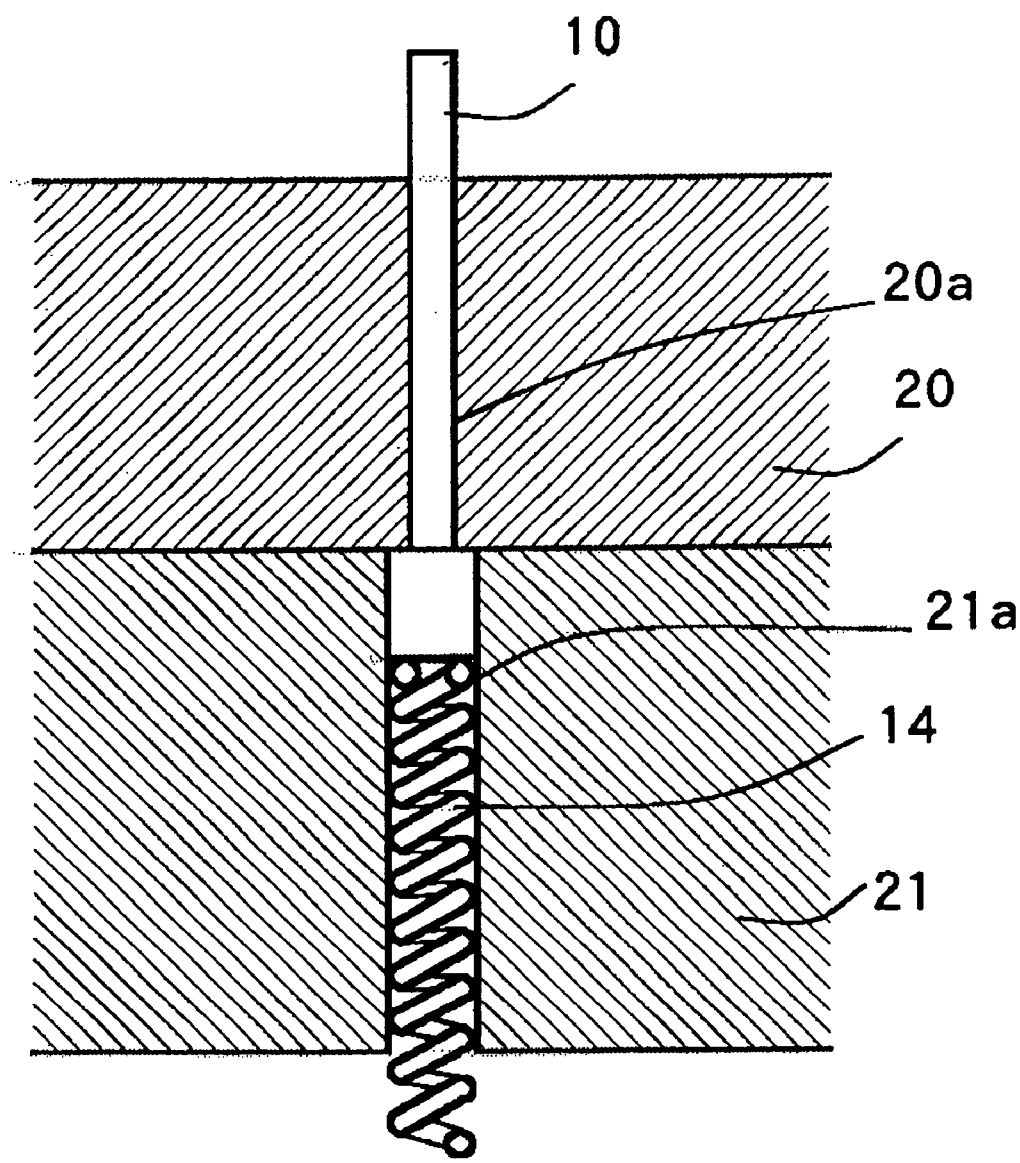
FIG. 8 is a figure to show the state wherein a contact pin and a spring are assembled onto a front surface plate and an intermediate plate.
Figure 9:
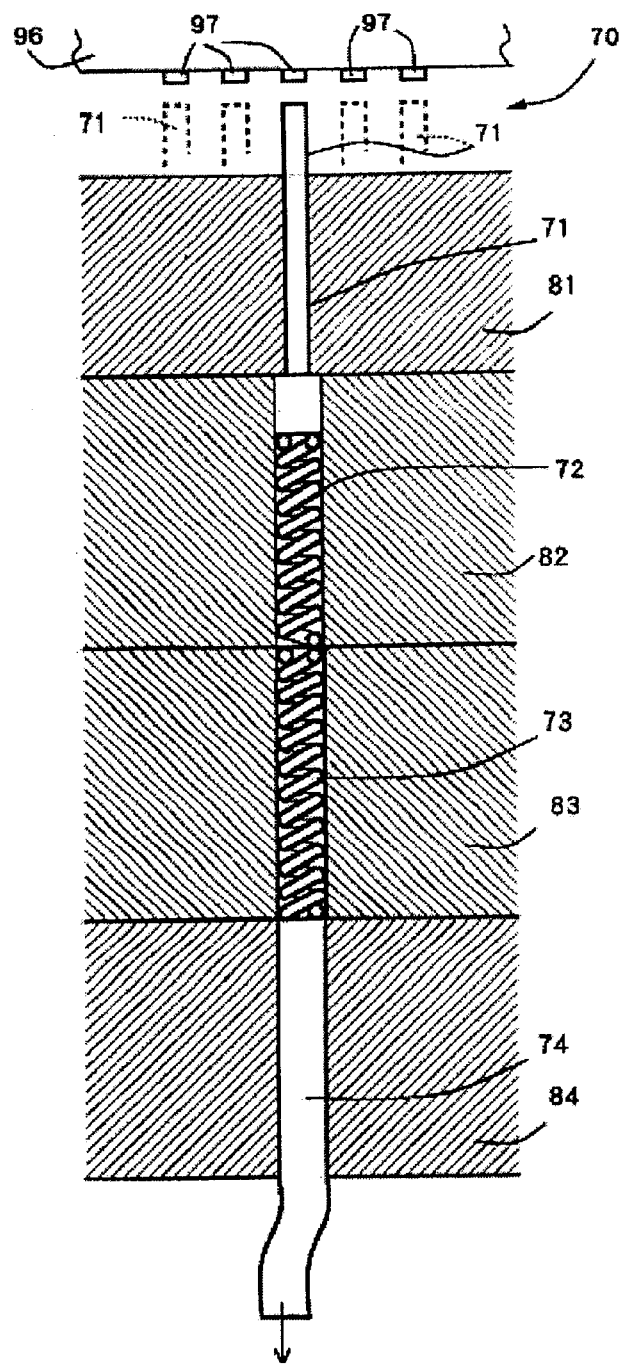
FIG. 9 is a figure showing a conventional checker head.
Figure 10:
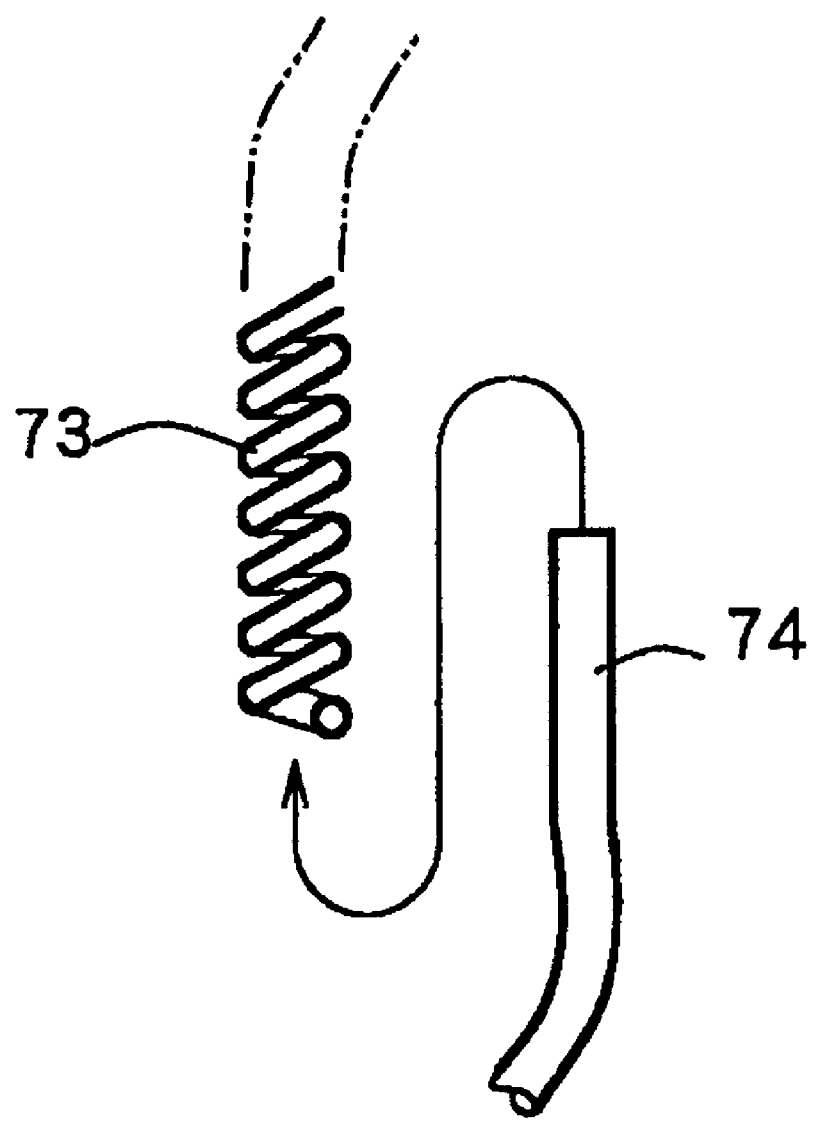
FIG. 10 is a figure to show an operating process of inserting a conducting wire in a spring to manufacture a conventional checker head.

Here, a front surface plate 20, an intermediate plate 21, a contact pin 10 and a spring 14 are put together. With this purpose, a shank 11 of the contact pin 10 is inserted in a hole 20a of the front surface plate 20 from the backside. And the intermediate plate 21 is put on the backside of the front surface plate 20, and is bonded together. A brim part 12 of the contact pin 10 enters in a hole 21a of the intermediate plate 21 then. Furthermore, the spring 14 is inserted in the hole 21a of the intermediate plate 21 from the backside. A state shown in FIG. 8 is provided by this. In this state, the spring 14 protrudes from the hole 21a of the intermediate plate 21 by only the brim part 12 of the contact pin 10. Still, this assembly work to get a state shown in FIG. 8 may be done by the order that is easy to be done for a worker. For example, a front surface plate 20 and an intermediate plate 21 are aligned and bonded together, and a contact pin 10 and a spring 14 may be inserted in these. Or when putting an intermediate plate 21 on a front surface plate 20 that a contact pin 10 has is inserted in, a spring 14 may have been inserted in a hole 21a of the intermediate plate 21 beforehand.

Figure 7:
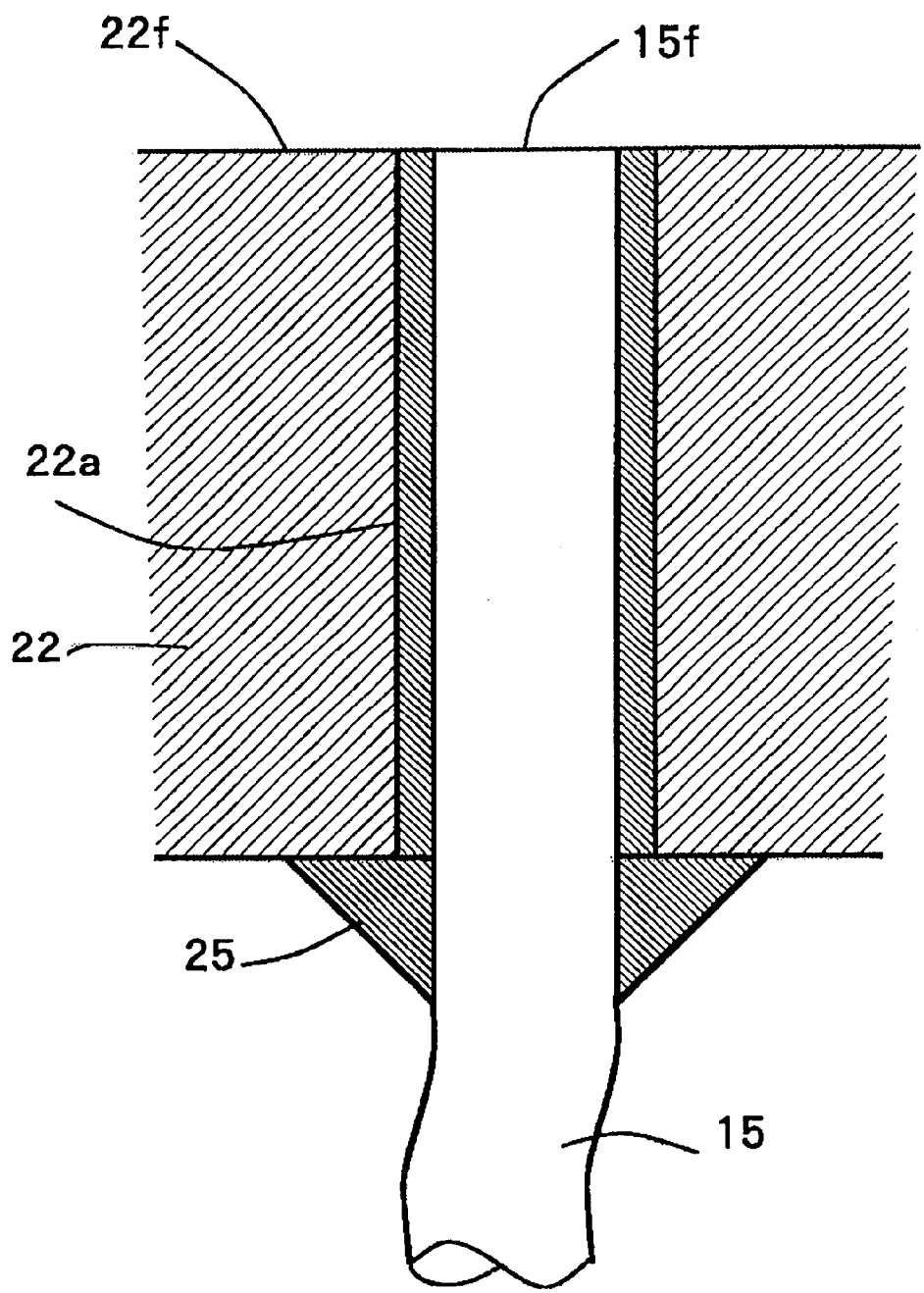
FIG. 7 is a figure to show the state wherein a part protruding from a rear surface plate of a conductive wire is removed.

And a thing shown in FIG. 8 is put on a thing shown in FIG. 7 (a spring 14 is compressed then), and an intermediate plate 21 and a rear surface plate 22 are aligned and bonded together, and then a checker head 1 shown in FIG. 1 is completed. In this manufacturing method, an operation of inserting a conductive wire into the inside of a spring is not included, so that it is easy and hard to fail, then a high non-defective unit rate can be expected.

As discussed in detail above, in this preferred embodiment, a conductive wire with self-bonding is used as a conductive wire 15, and after the conductive wire 15 is inserted in a hole 22a of a rear surface plate 22, tentative fixation is done with using the self-bonding. So, without completely bonding on every case, an operation such as plugging or wiring of other conductive wire 15 can be done. Adhesive strength bearing elasticity of a spring 14 is provided because a completely bonding of the rear surface plate 22 and the conductive wire 15 is done afterwards. This reduces an operation of inserting the conductive wire into the inside of the spring, and then a checker head 1 can be manufactured easily. In addition, because a projection part is removed and flattened after having completely bonded the rear surface plate 22 and the conductive wire 15, the joining with an assembling body of a front surface plate 20 and an intermediate plate 21 is easy, and the uniform pressing force can be put to each contact pin 10 in this checker head 1. Furthermore, because the conductive wire 15 having a diameter larger than the inside diameter of the spring 14 is used, even if the front surface plate 20 and the intermediate plate 21 and the rear surface plate 22 are not aligned with a very strictly precision, an electrical continuity with the spring 14 and the conductive wire 15 is provided. In addition, a large electric current can be coped with. In addition, the number of sheets of a plate is only three, and the kind of a spring is only one, so that few parts counts realizes an easy process control.

Still, above-mentioned preferred embodiment is only a simple example, and it dose not limit the present invention to what. Therefore natural, on the present invention, various kinds of improvement, transformation are possible in the range that does not deviate from the subject matter. For example, a numeric value shown as a dimension of each parts is one example when 0.25 mm pitch is premised, so even a dimension of others does not mind.

In the above described checker head, a brim part of a contact pin is located between a front surface plate and a rear surface plate. And the contact pin being pulled up to the front of the front surface plate is prevented by the front of a brim part being in contact with the circumference of a hole of the front surface plate from the rear. In addition, a spring is placed between a brim part of a contact pin and a rear plate in a compressed state. Because of this the backward edge of the spring is in contact with a conducting wire bonded to the rear surface plate. In addition, the front edge of a spring pushes a contact pin toward the front. The contact pin is pushed back by elasticity of this spring when the contact pin is pushed into a hole by a contact with an inspected object. The inspected object comes in contact with the head of the contact pin surely, and continuity is taken by this. And, the contact pin and a conductive wire are come in contact with over the spring, and continuity is taken.

This checker head can be manufactured without being accompanied with an operation of pushing a conductive wire into a spring. Because of this, the manufacturing man-hour decreases and the yield is high, too. In addition, a number of a spring as a parts count is only one, so that the pushing presser of each contact pin is hard to become nonuniform and the burden of the manufacturing control is small.

For this checker head, it is desirable to have: an intermediate plate that is pinched between a front surface plate and a rear surface plate, and wherein a hole is formed at a position corresponding both to a position of a hole of the front surface plate and that of the rear surface plate; a brim part and a spring which are located in the hole of the intermediate plate; and a conducting wire whereof end face being contact with the spring being identical to the front surface in the rear surface plate. The reason is because above described constitution is easy to be assembled by only putting the rear surface plate wherein the conductive wire is assembled to the front surface plate and the intermediate plate wherein a contact pin and a spring is assembled being joined.

Furthermore, in this checker head, it is desirable that the diameter of a conductive wire is larger than the average of the inside diameter and the outside diameter of a spring. The reason is because certain continuity between the spring and the conductive wire becomes true, and then the checker head becomes to be coped with a use for a large current. Still, what can use such a large conductive wire is because an operation of pushing the conductive wire into the spring is not accompanied with the manufacturing this checker head.

According to above described manufacturing method, with the Process 1 to 3, an adhesion body with a conductive wire and a rear surface plate is provided. In this Process 3, a part of an adhesive agent that had overflowed to the front of the rear surface plate in Process 2, and was solidified is removed, too. Thereupon, a front surface plate and an intermediate plate wherein a contact pin and a spring have been inserted in those holes are put together, and then each plate is joined together, so that a checker head is produced. Because an operation of inserting a conductive wire in the inside of a spring is not included in this manufacturing process, the man-hour decreases, and the yield is high, too. In these processes, there is not a limit in particular in an assembling order of a front plate, an intermediate plate, a contact pin and a spring. For example, it may be done as bellows: a contact pin is inserted in a hole of a front surface plate from the rear, and thereupon, an intermediate plate is affixed so as to locate a brim part in its hole, and then a spring is pushed into the hole of the intermediate plate. Or it may be done as bellows: a contact pin is inserted into a hole of a front surface plate from the rear, and a spring is pushed into a hole of an intermediate plate, and then the front surface plate and the intermediate plate are affixed together without slipping out the contact pin and the spring from each hole, and so as to locate a brim part in the hole of the intermediate plate.

In these processes, it is preferable to use a wire with self-bonding as the conductive wire. By using the self-bonding before the Process 2, a conducting wire and a rear plate can be fixed temporarily. When manufacturing a checker head really, a lot of holes are made in a rear surface plate (similar other plates), and a conductive wire is inserted in every hole respectively, and is bonded respectively. Here, it is convenient that whenever one or several of conductive wire are inserted in each hole, the conductive wire is fixed temporary, and after all conductive wires have been inserted over, they are adhered. The reason is because, while the inserting operation is continued, a conductive wire inserted already does not slipping out and another operation such as the wiring can be done depending on need. In addition, the reason is because an adhesion operation of Process 2 can is finished at once. As the conductive wire of self-bonding, a conductive wire applied adhesive thinly circumferentially can be nominated. Concretely, it is preferable to use a conductive wire provided as "self welding enameled wire" in a market.

In addition, in Process 3, it is desirable to flatten the end face of a conducting wire against the front of a rear surface plate. The reason is because; the operation of putting such as an intermediate plate to the top of an adhesion body of a conductive wire and a rear surface plate is easy to be done. In addition, the reason is because the power that a spring pushes a contact pin toward the front becomes uniform.

And, in a production method of this checker head, it is desirable to use a conductive wire whereof diameter is larger than the average of the inside diameter and the outside diameter of a spring. The reason is because certain continuity with a spring and a conductive wire can be provided. In addition, the reason is because a checker head that can cope with a use of a large electric current can be provided. Still, because an operation of pushing a conductive wire into a spring is not accompanied with this method, even if such a large conductive wire is used, the operation does not need to become difficult.

Obviously, numerous modifications and variations of the present invention are possible in light of the above teachings. It is therefore to be understood that within the scope of the appended claims, the invention may be practiced otherwise than as specifically described herein.

What is claimed as new and desired to be Secured by Letters Patent of the United States is:

1. A checker head comprising:
    a front plate in which a front through hole is formed and which has a front surface configured to face an object to be inspected;
    a rear plate in which a rear through hole is formed to correspond to said front through hole of said front plate;
    an intermediate plate in which an intermediate through hole is formed to correspond to said front and rear through holes and which is sandwiched between said front plate and said rear plate;
    an electro-conductive contact pin having a front tip part and a rear brim part which has a diameter larger than that of the front through hole, the front tip part protruding from the front surface of said front plate and configured to contact the object to be inspected, the contact pin being positioned such that the rear brim part is located in the intermediate through hole;

a conductive wire inserted into said rear through hole of said rear plate and bonded to said rear plate;

an electro-conductive spring provided in the intermediate through hole between said conductive wire and said rear brim part of said contact pin in a compressed state, said spring electrically connecting said contact pin and said conductive wire, said spring directly contacting one end of said conductive wire; and said one end of said conductive wire and a front surface of the rear plate which faces the intermediate plate being substantially on a same plane.

2. A checker head according to claim 1, wherein a diameter of said conductive wire is larger than an average of an inside diameter and an outside diameter of said spring.

3. A method of manufacturing a checker head, comprising:

inserting a conductive wire in a rear through hole of a rear plate (Process 1);

bonding said conductive wire and said rear plate together (Process 2);

removing a portion of the conductive wire protruding from a front surface of said rear plate which faces an intermediate plate such that one end of said conductive wire and the front surface of the rear plate are substantially on a same plane (Process 3);

inserting a spring in an intermediate through hole of the intermediate plate;

inserting an electro-conductive contact pin in a front through hole of a front plate from a rear surface of the front plate facing the intermediate plate such that a front tip part of the contact pin protrudes from a front surface of the front plate; and connecting said rear plate, said intermediate plate and said front plate to sandwich said intermediate plate between the front and rear plates and to compress said spring between said conductive wire and said contact pin such that said spring directly contacts the one end of said conductive wire.

4. A method of manufacturing a checker head according to claim 3, further comprising:

prefixing said conductive wire and said rear plate by using self-bonding characteristics of said conductive wire before bonding said conductive wire and said rear plate.

5. A method of manufacturing a checker head according to claim 3, wherein a diameter of said conductive wire is larger than an average of an inside diameter and an outside diameter of said spring.

6. A method of manufacturing a checker head according to claim 4, wherein a diameter of said conductive wire is larger than an average of an inside diameter and an outside diameter of said spring.

* * * * *